United States Patent
Wang et al.

(10) Patent No.: US 10,707,844 B2
(45) Date of Patent: Jul. 7, 2020

(54) RING VOLTAGE-CONTROLLED OSCILLATOR AND PHASE-LOCKED LOOP

(71) Applicant: CSMC TECHNOLOGIES FAB2 CO., LTD., Wuxi New District, Jiangsu (CN)

(72) Inventors: Xueyan Wang, Jiangsu (CN); Qiang Chen, Jiangsu (CN)

(73) Assignee: CSMC TECHNOLOGIES FAB2 CO., LTD., Wuxi New District (CN)

(*) Notice: Subject to any disclaimer, the term of this patent is extended or adjusted under 35 U.S.C. 154(b) by 0 days.

(21) Appl. No.: 16/312,345

(22) PCT Filed: Jun. 21, 2017

(86) PCT No.: PCT/CN2017/089298
§ 371 (c)(1),
(2) Date: Dec. 21, 2018

(87) PCT Pub. No.: WO2018/001146
PCT Pub. Date: Jan. 4, 2018

(65) Prior Publication Data
US 2019/0238122 A1    Aug. 1, 2019

(30) Foreign Application Priority Data

Jun. 30, 2016 (CN) .......................... 2016 1 0515233

(51) Int. Cl.
*H03K 3/03* (2006.01)
*H03K 5/134* (2014.01)
(Continued)

(52) U.S. Cl.
CPC ............. *H03K 3/0315* (2013.01); *H03B 5/20* (2013.01); *H03K 3/03* (2013.01); *H03K 3/0322* (2013.01); *H03K 5/134* (2014.07); *H03L 7/0995* (2013.01)

(58) Field of Classification Search
CPC .... H03B 27/00; H03K 3/0315; H03K 3/0322; H03K 5/134; H03L 7/0995
(Continued)

(56) References Cited

U.S. PATENT DOCUMENTS 5,191,295 A * 3/1993 Necoechea ........ G01R 31/2846
327/158
5,298,870 A * 3/1994 Cytera ..................... H03B 5/24
331/108 B
(Continued)

FOREIGN PATENT DOCUMENTS

CN     1681196 A    10/2005
CN    101127525 A    2/2008
(Continued)

OTHER PUBLICATIONS

International Search Report dated Sep. 26, 2017 in the parent application PCT/CN2017/089298. 4 pages.
(Continued)

*Primary Examiner* — Levi Gannon
(74) *Attorney, Agent, or Firm* — Polsinelli PC

(57) ABSTRACT

A ring voltage control oscillator includes: a conversion unit (100), cascaded multistage delay units (200) and cascaded multistage isolation buffer units (300). The conversion unit (100) receives a voltage signal controlled by the external, converts the voltage signal into a current signal and respectively transmits the current signal to a plurality of delay units (200) and a plurality of isolation buffer units (300). The delay unit (200) comprises two signal input terminals and two signal output terminals; the isolation buffer unit (300) comprises two signal input terminals and two signal output terminals; a first signal input terminal and a second signal input terminal of the isolation buffer unit (300) are correspondingly connected to a first signal output terminal and a second signal output terminal of the same stage of the delay
(Continued)

unit (200), respectively; clock signals outputted by first signal output terminals of two adjacent stages of the isolation buffering units (300) have the same phase difference; clock signals outputted by the second signal output terminals of two adjacent stages of the isolation buffering units (300) have the same phase difference.

14 Claims, 6 Drawing Sheets

(51) Int. Cl.
*H03B 5/20* (2006.01)
*H03L 7/099* (2006.01)

(58) Field of Classification Search
USPC .......................................................... 331/57
See application file for complete search history.

(56) References Cited

U.S. PATENT DOCUMENTS

| | | | | |
|---|---|---|---|---|
| 5,302,920 | A * | 4/1994 | Bitting | H03K 3/0315 |
| | | | | 327/101 |
| 5,917,383 | A * | 6/1999 | Tso | H03F 3/45511 |
| | | | | 331/135 |
| 6,163,226 | A * | 12/2000 | Jelinek | H03K 3/013 |
| | | | | 331/177 R |
| 7,126,431 | B2 * | 10/2006 | Mintchev | H03H 11/265 |
| | | | | 331/57 |
| 8,937,512 | B1 | 1/2015 | Huang et al. | |
| 9,444,435 | B1 * | 9/2016 | Monaco | H03K 3/0322 |
| 2005/0275470 | A1 * | 12/2005 | Choi | G06F 1/04 |
| | | | | 331/16 |
| 2006/0089114 | A1 * | 4/2006 | Maxim | H03D 3/006 |
| | | | | 455/179.1 |
| 2007/0152761 | A1 * | 7/2007 | Kim | H03L 7/093 |
| | | | | 331/16 |
| 2008/0111639 | A1 * | 5/2008 | Ryckaert | H03K 3/0322 |
| | | | | 331/57 |
| 2012/0008713 | A1 * | 1/2012 | Ebuchi | H03K 3/0322 |
| | | | | 375/295 |

FOREIGN PATENT DOCUMENTS

| | | |
|---|---|---|
| CN | 101252348 A | 8/2008 |
| CN | 101257290 B | 4/2010 |
| CN | 101820249 A | 9/2010 |
| CN | 102386914 A | 3/2012 |
| CN | 103414466 B | 1/2016 |

OTHER PUBLICATIONS

Office Action dated Apr. 28, 2019 issued in corresponding Chinese Patent Application No. 201610515233.4 (9 pages).

* cited by examiner

RING VOLTAGE-CONTROLLED OSCILLATOR AND PHASE-LOCKED LOOP

CROSS REFERENCE TO RELATED APPLICATIONS

This application is a National Phase filing under 35 U.S.C. § 371 of PCT/CN2017/089298 filed on Jun. 21, 2017, and claims priority to Chinese Patent Application No. CN 201610515233.4, entitled "RING VOLTAGE-CONTROLLED OSCILLATOR AND PHASE-LOCKED LOOP" filed on Jun. 30, 2016. The entire contents of each application are hereby incorporated by reference.

TECHNICAL FIELD

The present disclosure relates to the field of microelectronics technology, and particularly relates to a ring voltage control oscillator and a phase locked loop.

BACKGROUND

In modern communication systems, clock and data recovery (CDR) is widely applied in optical fiber communication transceivers. The phase locked loop (PLL) is mainly used in the clock and data recovery circuit, and the voltage control oscillator (VCO) is a core component of the phase locked loop and plays a decisive role for the performance of the phase locked loop. The design of the voltage control oscillator of high performance is always a research hotspot. At present, common integrated voltage control oscillators (VCOs) are mainly the inductance-capacitance voltage control oscillator (LC-VCO) and the ring voltage control oscillator (Ring-VCO). The ring voltage control oscillator can be manufactured by using the standard CMOS process, and it is easy to obtain a wide tuning range and multiphase clock output. In some applications (such as multi-clock circuits, on-chip systems and the like), the ring voltage control oscillator has unparalleled advantages.

The ring voltage control oscillator (Ring-VCO) in the conventional phase locked loop circuit is mostly a four-stage amplification circuit, and the number of phases corresponds to the number of stages of the amplification circuit. For example, a clock requiring eight phases uses an eight-stage amplification circuit. A general amplification circuit serves as a delay unit. When the eight-stage delay unit is used to obtain a clock of eight phases, the current consumed is proportional to the number of stages; the larger the power consumption is, the larger the occupied area is; moreover, for the same delay unit, the higher the number of stages is, the lower the speed is, which cannot achieve multi-phase clocks of high speed. Because lengths of connection wires between the stages have larger differences, the parasitic resistances and the capacitances of the connection wires are inconsistent, resulting in different parasitic delays, which ultimately affect different phase differences when a plurality of phase clocks are outputted, resulting in the error rate of data recovery in the application.

SUMMARY

Accordingly, it is necessary to provide a ring voltage control oscillator and a phase locked loop of high speed, low power consumption and small dimension.

A ring voltage control oscillator includes:

a conversion unit configured to receive a voltage signal controlled by the external, convert the voltage signal into a current signal and output the current signal;

cascaded multistage delay units configured to receive the current signal outputted by the conversion unit; the delay unit comprises two signal input terminals and two signal output terminals; a first signal output terminal and a second signal output terminal of the delay unit are correspondingly connected to a first signal input terminal and a second signal input terminal of a next stage of the delay unit, respectively; a first signal output terminal and a second signal output terminal of a last stage of the delay unit are correspondingly connected to a second signal input terminal and a first signal input terminal of a first stage of the delay unit, respectively; and multistage isolation buffer units configured to receive the current signal outputted by the conversion unit; the isolation buffer unit comprises two signal input terminals and two signal output terminals; a first signal input terminal and a second signal input terminal of the drive buffer unit are connected to a first signal output terminal and a second signal output terminal of the same stage of the delay unit, respectively;

wherein, clock signals outputted by first signal output terminals of two adjacent stages of the isolation buffer units have the same phase difference; second signal output terminals of two adjacent stages of the isolation buffer units output clock signals of the same phase difference.

Moreover, a phase locked loop is provided, which includes the above ring voltage control oscillator.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
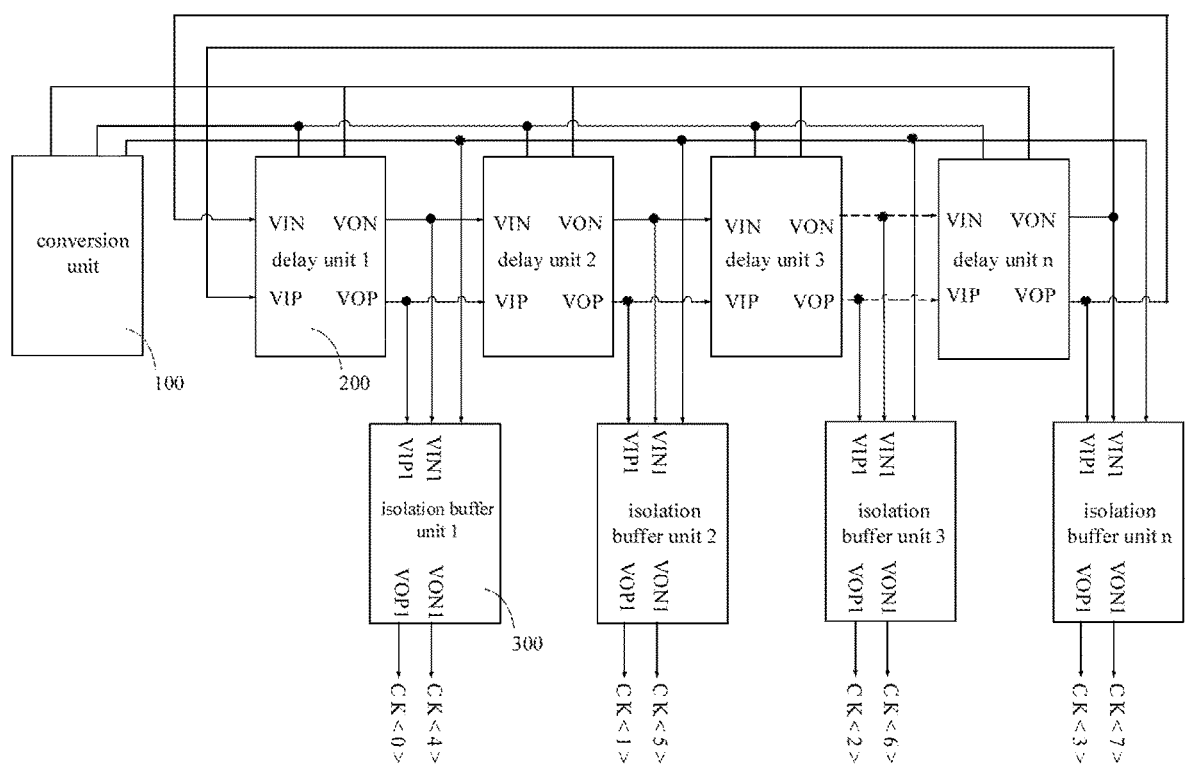
FIG. 1 is a block diagram of a ring voltage control oscillator in an embodiment.

FIG. 1 is a block diagram of a ring voltage control oscillator in an embodiment. The ring voltage control oscillator includes a conversion unit 100, cascaded multistage delay units 200, multistage isolation buffer units 300 and a power source (not shown). The power source is connected to a plurality of the delay units 200 and a plurality of the isolation buffer units 300, respectively; and supplies power to the plurality of the delay units 200 and the plurality of the isolation buffer units 300.

The conversion unit 100 receives a voltage signal controlled by the external, converts the voltage signal into a current signal and transmits the current signal to the plurality of the delay units 200 and the plurality of the isolation buffer units 300, respectively. Referring to FIG. 1, the conversion unit 100 outputs two current signals to the delay unit 200. The conversion unit 100 outputs a current signal to the delay buffer unit 300. The conversion unit 100 provides a mirror current for the delay unit 200 and the isolation buffer unit 300.

Each delay unit includes two signal input terminals and two signal output terminals; a first signal output terminal VON and a second signal output terminal VOP of the delay unit 200 are correspondingly connected to a first signal input terminal VIN and a second signal input terminal VIP of a next stage of the delay unit 200, respectively; a first signal output terminal VON and a second signal output terminal VOP of a last stage of the delay unit 200 are correspondingly connected to a second signal input terminal VIP and a first signal input terminal VIN of a first stage of the delay unit 200, respectively; so that a ring loop is formed by the plurality of the delay units 200. The frequency of the ring voltage control oscillator is changed by adjusting delay of the delay unit 200, and the respective clock signal is outputted.

The isolation buffer unit 300 includes two signal input terminals and two signal output terminals; a first signal input terminal VIN1 and a second signal input terminal VIP1 of the isolation buffer unit 300 are connected to a first signal output terminal VON and a second signal output terminal VOP of the same stage of the delay unit, respectively. The isolation buffer unit 300 has a role of protection and isolation for the delay unit 200, while providing the drive current of the multi-phase clock and reducing the influence of later stages of the circuit on the phase difference. The isolation buffer unit 300 itself adopts a fully differential structure, so that noise suppression is good, no other bias circuits are needed, the circuit structure is simple, and the power consumption is low.

In this embodiment, the number of the delay units 200 is four, and the number of the isolation buffer units 300 corresponding to the delay units 200 is also four. Each delay unit 200 can output two-phase clock signals, that is, eight-phase clocks. The number of clock signals outputted by the delay unit 200 is twice the number of the delay units 200. The ring voltage control oscillator implements a phase shift of 180 degrees from the input terminal of the delay unit 1 to the output terminal of the delay unit 4, which is a one-period oscillation signal. Given that the delay time of the single-stage delay unit 200 is $\Delta T$, the output signal period of the ring oscillator is $T=8*\Delta T$, that is to say, the phase shift of the single-stage delay unit 200 is 45 degrees, which can serve as a multi-phase clock output signal. By the drive isolation of the isolation buffer unit 300, four isolation buffer units output a total of eight clock signals CK<7:0>. Among them, CK<1> is delayed by 45° from CK<0>; similarly, CK<2> is delayed by 45° from CK<1>; until CK<7> is delayed by 45° from CK<6>.

In other embodiments, the number of the delay units 200 and the number of the isolation buffer units 300 may be three, six, or the like, and may be determined according to the number of required clock signals or the phase shift angle of the single-stage delay unit.

The first signal is a non-inverting signal of a data signal, and the second signal is an inverting signal of the same data signal. The phase differences of the first signals outputted in two adjacent stages of the isolation buffer units are 45 degrees. For example, the phase difference between the first signal CK4 of the isolation buffer unit 1 and the first signal CK5 of the isolation buffer unit 2 is 45 degrees; the phase difference between the first signal CK5 of the isolation buffer unit 2 and the first signal CK6 of the isolation buffer unit 3 is 45 degrees, and the like. Correspondingly, the phase differences of the second signals outputted by two adjacent stages of the isolation buffer units are 45 degrees. For example, the phase difference between the second signal CK1 of the isolation buffer unit 2 and the second signal CK2 of the isolation buffer unit 3 is 45 degrees, and the like.

A conventional voltage control oscillator requires eight-stage delay units to obtain eight-phase clocks. The power consumption is large because the current consumption is proportional to the number of stages. With the same delay units, the higher the number of stages is, the lower the speed is, so that multi-phase clocks of high speed cannot be implemented. However, the ring voltage control oscillator in the present disclosure replace conventional eight-stage delay units by four-stage delay units, and two output terminals of each stage of the delay unit output two phase clocks. The phase difference between the two phase clock signals of each stage of the delay unit is the same. The delay units in the ring voltage control oscillator have a less number of stages, low power consumption, small area, and low cost. At the same time, the peripheral circuit is isolated by the isolation buffer units, so that the influence of later stages of the circuit on the phase difference is reduced, and the error rate of data recovery is also reduced.

Figure 2:
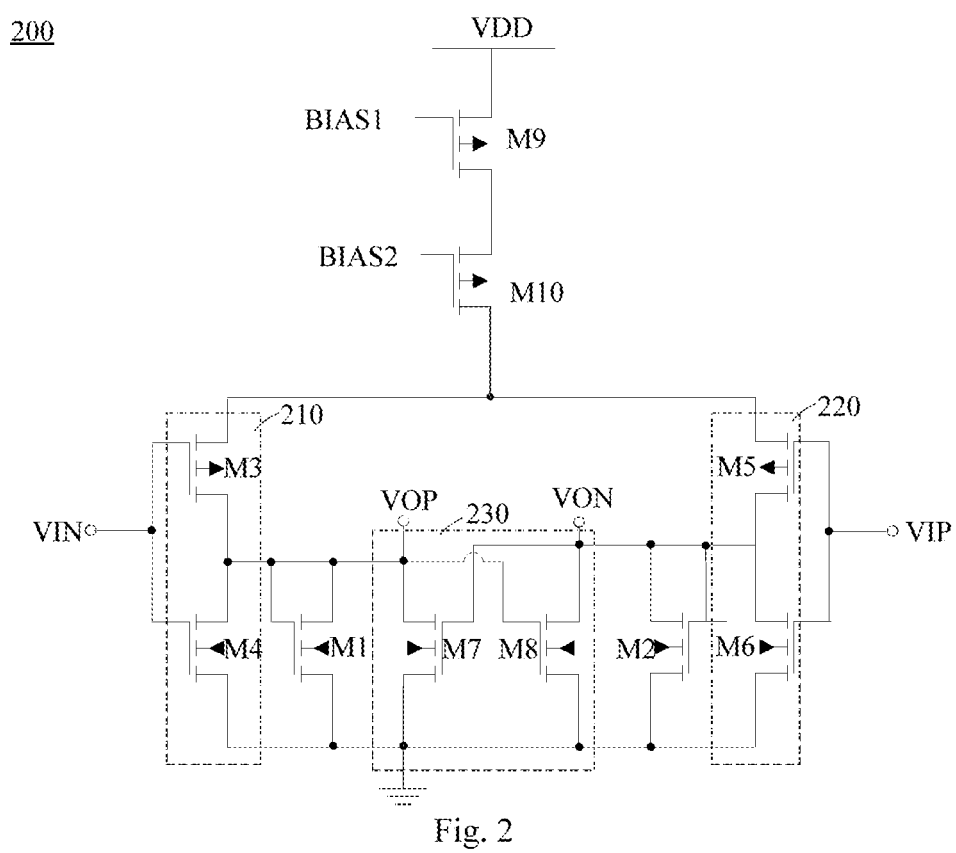
FIG. 2 is a circuit diagram of the delay unit of FIG. 1.

FIG. 2 is a circuit diagram of the delay unit in an embodiment. The delay unit 200 includes a first inverting circuit 210, a second inverting circuit 220, a first MOS transistor M1, a second MOS transistor M2, and a trans-coupling circuit 230. An input terminal and an output terminal of the first inverting circuit 210 correspondingly serve as the first signal input terminal VIN and the second signal output terminal VOP of the delay unit 200, respectively. An input terminal and an output terminal of the second inverting circuit 220 correspondingly serve as the second signal input terminal VIP and the first signal output terminal VON of the delay unit 200, respectively.

Both a gate and a drain of the first MOS transistor M1 are connected to the output terminal of the first inverting circuit 210. A first control terminal of the trans-coupling circuit 230 is connected to the output terminal of the second inverting circuit 220; a second control terminal of the trans-coupling circuit 230 is connected to the output terminal of the first inverting circuit 210. Both a gate and a drain of the second MOS transistor M2 are connected to the output terminal of the second inverting circuit 220. Both a source of the first MOS transistor M1 and a source of the second MOS transistor M2 are grounded, wherein the first MOS transistor M1 and the second MOS transistor M2 are both N type MOS devices; and their gates are connected to the drains, which is equivalent to a diode. Both a power supply terminal of the first inverting circuit 210 and a power supply terminal of the second inverting circuit 220 are connected to the power source VDD.

The first inverting circuit 210 includes a third MOS transistor M3 and a fourth MOS transistor M4; the second inverting circuit 220 includes a fifth MOS transistor M5 and a sixth MOS transistor M6. A gate of the third MOS transistor M3 is connected to a gate of the fourth MOS transistor M4; the gate of the third MOS transistor M3 serves as the input terminal of the first inverting circuit 210. A drain of the third MOS transistor M3 is connected to a drain of the fourth MOS transistor M4; the drain of the third MOS transistor M3 serves as the output terminal of the first inverting circuit 210. A source of the third MOS transistor M3 as the power supply terminal of the first inverting circuit 210 is connected to the power source VDD; and a source of the fourth MOS transistor M4 is grounded. A gate of the fifth MOS transistor M5 is connected to a gate of the sixth MOS transistor M6; the gate of the fifth MOS transistor M5 serves as the input terminal of the second inverting circuit 220. A drain of the fifth MOS transistor M5 is connected to a drain of the sixth MOS transistor M6; the drain of the fifth MOS transistor M5 serves as the output terminal of the second inverting circuit 220. A source of the fifth MOS transistor M5 as the power supply terminal of the second inverting circuit 220 is connected to the power source VDD; and a source of the sixth MOS transistor M6 is grounded. The third MOS transistor M3 is a P type MOS device; the fourth MOS transistor M4 is an N type MOS device. The first inverting circuit 210 consisted by the third MOS transistor M3 and the fourth MOS transistor M4 has the consistent structure as the digital inverter, which has the features of high speed and small device dimension. Correspondingly, the fifth MOS transistor M5 is a P type MOS device; the sixth MOS transistor M6 is an N type MOS device. The second inverting circuit 220 consisted by the fifth MOS transistor M5 and the sixth MOS transistor M6 has the consistent structure as the digital inverter.

The trans-coupling circuit 230 includes a seventh MOS transistor M7 and an eighth MOS transistor M8. A drain of the seventh MOS transistor M7 serves as a second control terminal of the trans-coupling circuit 230; a drain of the seventh MOS transistor M7 is connected to the output terminal of the first inverting circuit 210; a gate of the seventh MOS transistor M7 is connected to the output terminal of the second inverting circuit 220. A drain of the eighth MOS transistor M8 serves as a first control terminal of the trans-coupling circuit 230; a drain of the eighth MOS transistor M8 is connected to the output terminal of the second inverting circuit 220; a gate of the eighth MOS transistor M8 is connected to the output terminal of the first inverting circuit 210; and sources of the seventh MOS transistor M7 and the eighth MOS transistor M8 are grounded; wherein both the seventh MOS transistor M7 and the eighth MOS transistor M8 are N type MOS devices. This special connection manner of the seventh MOS transistor M7 and the eighth MOS transistor M8 in the trans-coupling circuit 230 ensures that signals outputted by the first signal output terminal VON and the second signal output terminal VOP have opposite phases.

The delay unit 200 further includes a ninth MOS transistor M9 and a tenth MOS transistor M10. A source of the ninth MOS transistor M9 is connected to the power source VDD; a gate of the ninth MOS transistor M9 is connected to the conversion unit 100; and a drain of the ninth MOS transistor M9 is connected to a source of the tenth MOS transistor M10; a gate of the tenth MOS transistor M10 is connected to the conversion unit 100; and a drain of the tenth MOS transistor M10 is connected to the drain of the third MOS transistor M3 and the drain of the fifth MOS transistor M5; wherein, both the ninth MOS transistor M9 and the tenth MOS transistor M10 in the delay unit 200 are P type MOS transistors to provide an adjustable current.

The first MOS transistor M1, the second MOS transistor M2, the fourth MOS transistor M4, the sixth MOS transistor M6, the seventh MOS transistor, and the eighth MOS transistor are all the first conductivity type MOS transistors; the third MOS transistor M3, the fifth MOS transistor M5, the ninth MOS transistor, and the tenth MOS transistor are all the second type conductivity MOS transistors. In this embodiment, the first conductivity type MOS transistor is an N type MOS transistor; the second conductivity type MOS transistor is a P type MOS transistor. In other embodiments, the first conductivity type MOS transistor may be a P type MOS transistor; and the second conductivity type MOS transistor may be an N type MOS transistor.

The circuit in the delay unit 200 belongs to a fully differential circuit, which combines the first inverting circuit 210 with the second inverting circuit 220, so as to have high common mode suppression characteristics and good noise performance; meanwhile, the delay unit 200 uses the first inverting circuit 210 and the second inverter circuit 220 as the main body of delay, so as to have high speed, small dimension, low power consumption and the like. By using the connection manner of the first MOS transistor M1, the second MOS transistor M2 and the trans-coupling circuit 230, symmetry of the differential output is ensured, and the anti-noise ability of the delay unit 200 is improved. The four-stage delay units 200 replace the conventional eight-stage delay units, wherein the two outputs of the differential serve as two phase clocks, and have the characteristics of a small number of stages, low power consumption, small area, and low cost.

Figure 3:
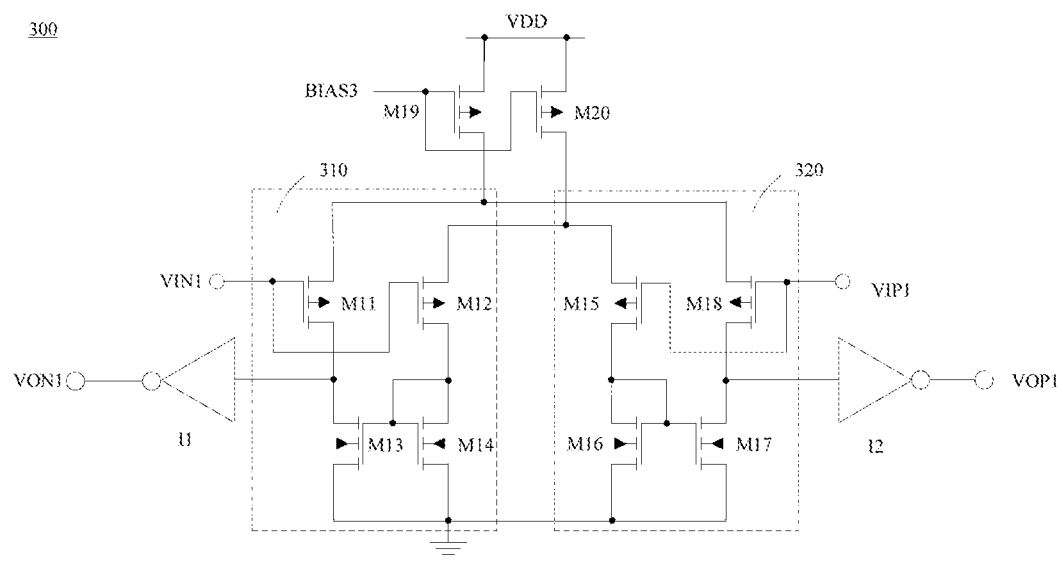
FIG. 3 is a circuit diagram of the isolation buffer unit of FIG. 1.

FIG. 3 is a circuit diagram of the isolation buffer unit in an embodiment. The isolation buffer unit 300 is a fully differential structure circuit including a first amplification circuit 310, a second amplification circuit 320, a first digital inverter I1, and a second digital inverter I2. The first digital inverter I1 and the second digital inverter I2 are configured to adjust the slopes of the rising and falling edges of the signal.

An input terminal of the first amplification circuit 310 is a first signal input terminal VIN1 of the isolation buffer unit 300, and is connected to the first signal output terminal VON of the delay unit 200. An input terminal of the second amplification circuit 320 is a second signal input terminal VIP1 of the isolation buffer unit 300, and is connected to the second signal output terminal VOP of the delay unit 200. Both the power supply terminals of the first amplification circuit 310 and the second amplification circuit 320 are connected to the power source VDD. The first amplification circuit 310 amplifies the signal outputted by the first signal output terminal VON of the delay unit 200 to a full swing. The second amplification circuit 320 amplifies the signal outputted by the second signal output terminal VOP of the delay unit 200 to a full swing.

The output terminal of the first amplification circuit 310 is connected to the input terminal of the first digital inverter I1, and the output terminal of the second amplification circuit 320 is connected to the input terminal of the second digital inverter I2. The output terminal of the first digital inverter I1 and the output terminal of the second digital inverter I2 output two phase clock signals.

The first amplification circuit 310 includes an eleventh MOS transistor M11, a twelfth MOS transistor M12, a thirteenth MOS transistor M13, and a fourteenth MOS transistor M14. The second amplification circuit includes a fifteenth MOS transistor M15, a sixteenth MOS transistor M16, a seventeenth MOS transistor M17, and an eighteenth MOS transistor M18.

A gate of the eleventh MOS transistor M11 is the input terminal of the first amplification circuit 310, the gate of the eleventh MOS transistor M11 is connected to a gate of the twelfth MOS transistor M12, and a source of the eleventh MOS transistor M11 is connected to the power source VDD and a source of an eighteenth MOS transistor M18, respectively; a drain of the eleventh MOS transistor M11 is connected to the first digital inverter I1 and a drain of the thirteenth MOS transistor M13, respectively. A source of the twelfth MOS transistor M12 is connected to the power source VDD and a source of the fifteenth MOS transistor M15, respectively; the drain of the twelfth MOS transistor M12 is connected to a gate of the thirteenth MOS transistor M13 and a drain and a gate of the fourteenth MOS transistor M14. A gate of the fifteenth MOS transistor M15 is connected to a gate of the eighteenth MOS transistor M18 to serve as the input terminal of the second amplification circuit 320; a drain of the fifteenth MOS transistor M15 is connected to a drain and a gate of the sixteenth MOS transistor M16 and a gate of the seventeenth MOS transistor M17. A drain of the seventeenth MOS transistor M17 is connected to the second digital inverter I2 and a drain of the eighteenth MOS transistor M18, respectively. Sources of the thirteenth MOS transistor M13, the fourteenth MOS transistor M14, the sixteenth MOS transistor M16, and the seventeenth MOS transistor M17 are all grounded.

The thirteenth MOS transistor M13, the fourteenth MOS transistor M14, the sixteenth MOS transistor M16, and the seventeenth MOS transistor M17 are all the first conductivity type MOS transistors; the eleventh MOS transistor M11, the twelfth MOS transistor M12, the fifteenth MOS transistor M15 and the eighteenth MOS transistor M18 are all the second conductivity type MOS transistors. In this embodiment, the first conductivity type MOS transistor is an N type MOS transistor; the second conductivity type MOS transistor is a P type MOS transistor. In other embodiments, the first conductivity type MOS transistor is a P type MOS transistor; the second conductivity type MOS transistor is an N type MOS transistor. The conductivity type of the MOS transistor can be uniformly set according to an actual requirement.

The isolation buffer unit 300 further includes a nineteenth MOS transistor M19 and a twentieth MOS transistor M20. A gate of the nineteenth MOS transistor M19 is connected to the conversion unit 100 and a gate of the twentieth MOS transistor M20, respectively; both a source of the nineteenth MOS transistor M19 and a source of the twentieth MOS M20 are connected to the power source VDD. A drain of the nineteenth MOS transistor M19 is connected to the source of the eleventh MOS transistor M11 and the source of the eighteenth MOS transistor M18, respectively. A drain of the twentieth MOS transistor M20 is connected to the source of the twelfth MOS transistor M12 and the source of the fifteenth MOS transistor M15, respectively. The nineteenth MOS transistor M19 and the twentieth MOS transistor M20 can provide current while suppressing power source noise.

The isolation buffer unit 300 serves as the next stage of the delay unit 200, and isolates the output of the delay unit 200 from the peripheral circuit, which increases driving of the multi-phase clock and reduces the influence of later stages of the circuit of on the phase difference. The drive buffer circuit itself adopts a fully differential structure, so that common mode noise is suppressed strongly; the output signal is a full swing digital clock with a duty ratio of 50%; no other bias circuits are needed, the circuit structure is simple and the power consumption is low.

Figure 4:
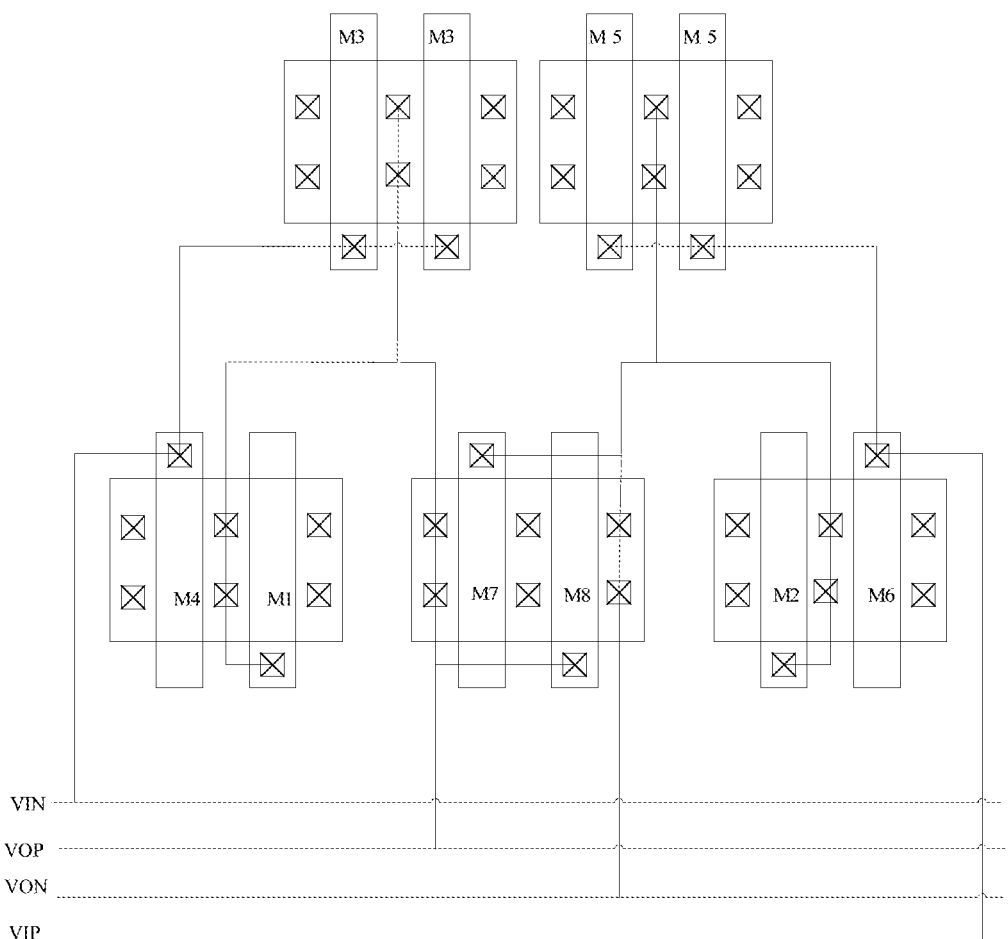
FIG. 4 is a part of a circuit layout diagram of the delay unit in an embodiment.

FIG. 4 is a part of a circuit layout diagram of the delay unit in an embodiment; wherein, the first MOS transistor and the second MOS transistor, the third MOS transistor and the fifth MOS transistor, and the fourth MOS transistor and the sixth MOS transistor are centrally symmetrically arranged, respectively; and the connection wires between the respective MOS transistors are symmetrical and have the same length. By the symmetrical layout of the plurality of MOS transistors in the delay unit 200, a symmetrical full differential structure is implemented, and common mode noise is suppressed.

Figure 5:
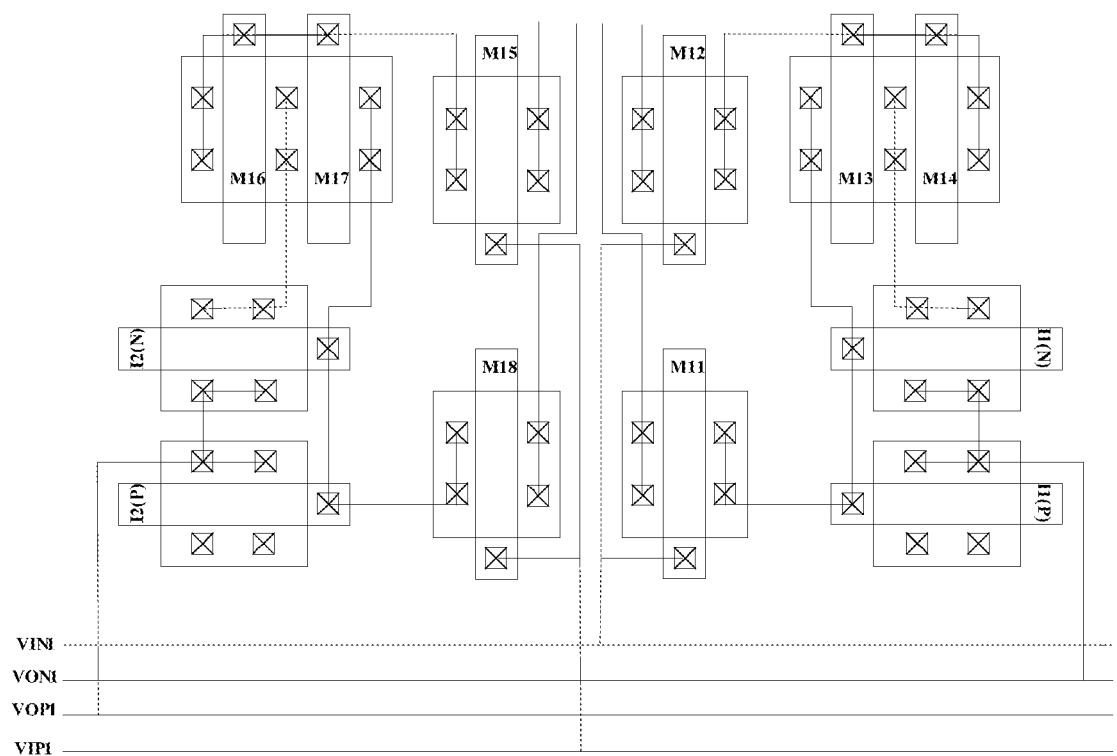
FIG. 5 is a part of a circuit layout diagram of the isolation buffer unit in an embodiment.

FIG. 5 is a part of a circuit layout diagram of the isolation buffer unit in an embodiment; wherein, the eleventh MOS transistor and the eighteenth MOS transistor, the twelfth MOS transistor and the fifteenth MOS transistor, the thirteenth MOS transistor and the seventeenth MOS transistor, the fourteenth MOS transistor and the sixteenth MOS transistor, and the first digital inverter and the second digital inverter are centrally symmetrically arranged, respectively; so that the anti-noise capability is improved. When setting the relative positions of each MOS transistor, the first digital inverter I1, and the second digital inverter I2 in the isolation buffer unit 300, the connection wire between the respective components is also fully taken into consideration to make it shortest; so that the transmission speed of the clock signal is fast, while crossing of the signal lines is reduced, so as to avoid influencing the phase difference of a plurality of output clocks.

Figure 6:
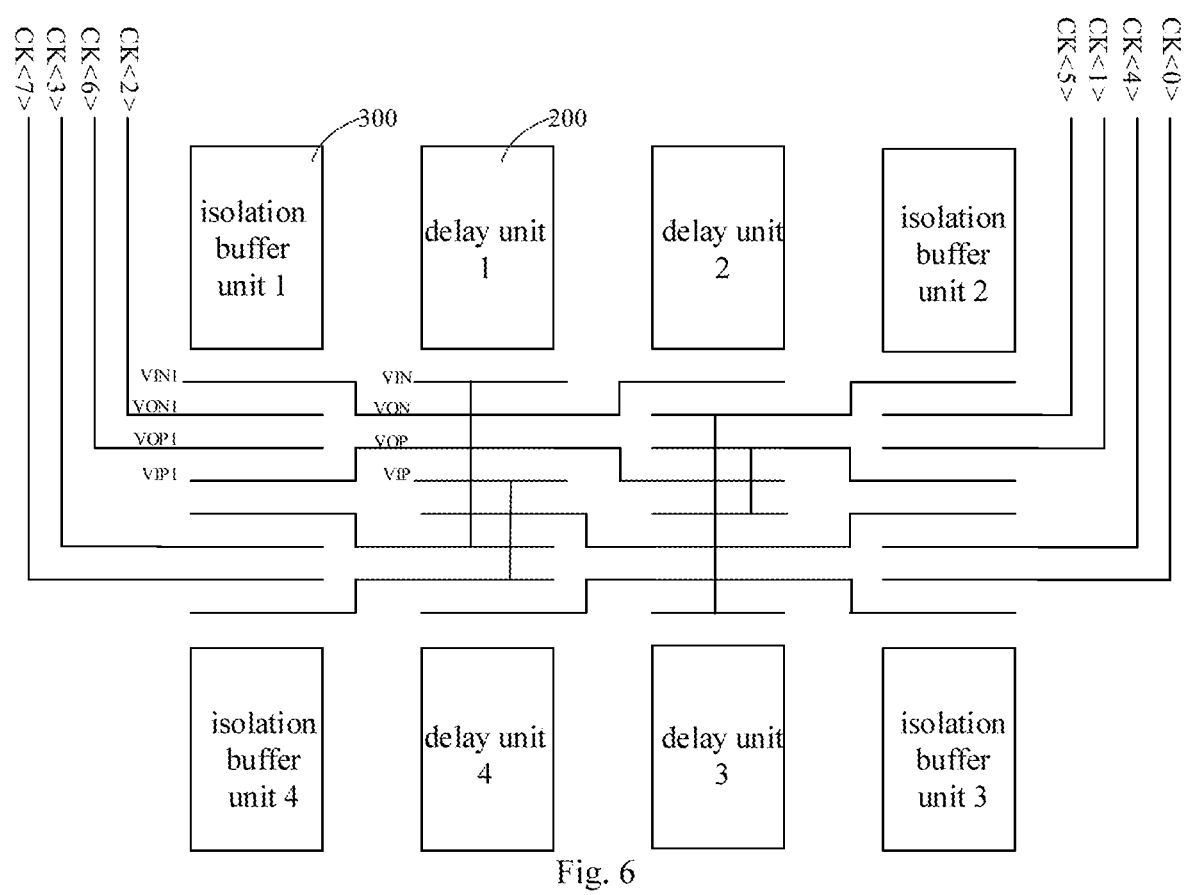
FIG. 6 is an integral layout diagram of the ring voltage control oscillator in an embodiment.

FIG. 6 is an integral layout diagram of the ring voltage control oscillator in an embodiment. The four-stage delay units 200 are annularly arranged in the clockwise direction in the middle of the entire circuit board. The delay units 200 of the ring voltage control oscillator are placed in a ring shape; the connection wire between the delay units 200 of each stage is basically the same; the corresponding parasitic parameters are basically the same, so as to ensure the phase difference of the outputted multiphase clock to be the same. Correspondingly, the isolation buffer units 300 are symmetrically arranged on both sides of the delay units 200, so that the delay units 200 and the isolation buffer units 300 are completely differential symmetrical, which improves the anti-noise capability. The connection wires the delay units 200 and the isolation buffer units 300 of respective stages are basically the same and will not influence the phase difference of multiple output clocks.

Further, a phase locked loop is provided, which includes the above-mentioned ring voltage control oscillator. By the ring voltage control oscillator, the phase locked loop can obtain multiple clocks with different phases of the same frequency, which integrates the advantages of high speed, low power consumption, small area, low cost, strong anti-noise capacity and the like.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A ring voltage control oscillator, comprising:
a conversion unit configured to receive an externally controlled voltage signal, and output a control current signal;
cascaded multistage delay units configured to receive the control current signal outputted by the conversion unit; wherein the delay unit comprises two signal input terminals and two signal output terminals;
a first signal output terminal and a second signal output terminal of the delay unit are correspondingly connected to a first signal input terminal and a second signal input terminal of a next stage of the delay unit, respectively;
a first signal output terminal and a second signal output terminal of a last stage of the delay unit are correspondingly connected to a second signal input terminal and a first signal input terminal of a first stage of the delay unit, respectively;
multistage isolation buffer units configured to receive the control current signal outputted by the conversion unit; wherein the isolation buffer unit comprises two signal input terminals and two signal output terminals; a first signal input terminal and a second signal input terminal of the isolation buffer unit are connected to a first signal output terminal and a second signal output terminal of the same stage of the delay unit, respectively;
wherein clock signals outputted by first signal output terminals of two adjacent stages of the isolation buffer units have a first phase difference;
wherein second signal output terminals of two adjacent stages of the isolation buffer units correspondingly output clock signals having a second phase difference equal to the first phase difference;
wherein the delay unit comprises a first inverting circuit, a second inverting circuit, a first MOS transistor, a second MOS transistor, and a trans-coupling circuit;
an input terminal and an output terminal of the first inverting circuit correspondingly serve as the first signal input terminal and the second signal output terminal of the delay unit, respectively;
an input terminal and an output terminal of the second inverting circuit correspondingly serve as the second signal input terminal and the first signal output terminal of the delay unit, respectively;
both a gate and a drain of the first MOS transistor are connected to the output terminal of the first inverting circuit;
a first control terminal of the trans-coupling circuit is connected to the output terminal of the second inverting circuit;
a second control terminal of the trans-coupling circuit is connected to the output terminal of the first inverting circuit;
both a gate and a drain of the second MOS transistor are connected to the output terminal of the second inverting circuit;
both a source of the first MOS transistor and a source of the second MOS transistor are grounded, wherein the first MOS transistor and the second MOS transistor are both first conductivity type MOS transistors; and both a power supply terminal of the first inverting circuit and a power supply terminal of the second inverting circuit are connected to the power source.

2. The ring voltage control oscillator of claim 1, wherein a first signal outputted by the first signal output terminal of the delay unit is inverted relative to a second signal outputted by the second signal output terminal of the delay unit.

3. The ring voltage control oscillator of claim 1, wherein the first inverting circuit comprises a third MOS transistor and a fourth MOS transistor;
a gate of the third MOS transistor is connected to a gate of the fourth MOS transistor; the gate of the third MOS transistor serves as the input terminal of the first inverting circuit; a drain of the third MOS transistor is connected to a drain of the fourth MOS transistor; the drain of the third MOS transistor serves as the output terminal of the first inverting circuit; a source of the third MOS transistor is connected to the power source; and a source of the fourth MOS transistor is grounded;
the fourth MOS transistor is a first conductivity type MOS transistor; and the third MOS transistor is a second type conductivity MOS transistor.

4. The ring voltage control oscillator of claim 3, wherein the second inverting circuit comprises a fifth MOS transistor and a sixth MOS transistor;
a gate of the fifth MOS transistor is connected to a gate of the sixth MOS transistor; the gate of the fifth MOS transistor serves as the input terminal of the second inverting circuit; a drain of the fifth MOS transistor is connected to a drain of the sixth MOS transistor; the drain of the fifth MOS transistor serves as the output terminal of the second inverting circuit; a source of the fifth MOS transistor is connected to the power source; and a source of the sixth MOS transistor is grounded;
the sixth MOS transistor is a first conductivity type MOS transistor; and the fifth MOS transistor is a second type conductivity MOS transistor.

5. The ring voltage control oscillator of claim 4, wherein the delay unit further comprises a ninth MOS transistor and a tenth MOS transistor;
a source of the ninth MOS transistor is connected to the power source; a gate of the ninth MOS transistor is connected to the conversion unit; and a drain of the ninth MOS transistor is connected to a source of the tenth MOS transistor;
a gate of the tenth MOS transistor is connected to the conversion unit; and a drain of the tenth MOS transistor is connected to the drain of the third MOS transistor and the drain of the fifth MOS transistor;
wherein, both the ninth MOS transistor and the tenth MOS transistor are the second conductivity type MOS transistors.

6. The ring voltage control oscillator of claim 4, wherein the first MOS transistor and the second MOS transistor, the third MOS transistor and the fifth MOS transistor, the fourth MOS transistor and the sixth MOS transistor are centrally symmetrically arranged, respectively.

7. The ring voltage control oscillator of claim 4, wherein the first conductivity type MOS transistor is an N type MOS transistor; and the second conductivity type MOS transistor is a P type MOS transistor.

8. The ring voltage control oscillator of claim 3, wherein the trans-coupling circuit comprises a seventh MOS transistor and an eighth MOS transistor;
a drain of the seventh MOS transistor is connected to the output terminal of the first inverting circuit; a gate of the seventh MOS transistor is connected to the output terminal of the second inverting circuit;

a drain of the eighth MOS transistor is connected to the output terminal of the second inverting circuit; a gate of the eighth MOS transistor is connected to the output terminal of the first inverting circuit;

sources of the seventh MOS transistor and the eighth MOS transistor are grounded;

wherein both the seventh MOS transistor and the eighth MOS transistor are first type MOS transistors.

9. The ring voltage control oscillator of claim 1, wherein the isolation buffer unit is a fully differential structure circuit comprising a first amplification circuit, a second amplification circuit, a first digital inverter and a second digital inverter;

an input terminal of the first amplification circuit is the first signal input terminal of the isolation buffer unit and is connected to the first signal output terminal of the delay unit; an input terminal of the second amplification circuit is the second signal input terminal of the isolation buffer unit and is connected to the second signal output terminal of the delay unit;

both power supply terminals of the first amplification circuit and the second amplification circuit are connected to the power source;

an output terminal of the first amplification circuit is connected to an input terminal of the first digital inverter; and an output terminal of the second amplification circuit is connected to an input terminal of the second digital inverter;

an output terminal of the first digital inverter and an output of the second digital inverter output two phase clock signals, respectively.

10. The ring voltage control oscillator of claim 9, wherein the first amplification circuit comprises an eleventh MOS transistor, a twelfth MOS transistor, a thirteenth MOS transistor and a fourteenth MOS transistor; a gate of the eleventh MOS transistor is the input terminal of the first amplification circuit; the gate of the eleventh MOS transistor is connected to a gate of the twelfth MOS transistor; a source of the eleventh MOS transistor is connected to the power source and a source of an eighteenth MOS transistor, respectively;

a drain of the eleventh MOS transistor is connected to the first digital inverter and a drain of the thirteenth MOS transistor, respectively;

a source of the twelfth MOS transistor is connected to the power source; a drain of the twelfth MOS transistor is connected to a gate of the thirteenth MOS transistor, and a drain and a gate of the fourteenth MOS transistor, respectively;

sources of the thirteenth MOS transistor, the fourteenth MOS transistor, the sixteenth MOS transistor and the seventeenth MOS transistor are all grounded;

both the thirteenth MOS transistor and the fourteenth MOS transistor are the first conductivity type MOS transistors; both the eleventh MOS transistor and the twelfth MOS transistor are all the second conductivity type MOS transistors.

11. The ring voltage control oscillator of claim 10, wherein the second amplification circuit comprises a fifteenth MOS transistor, a sixteenth MOS transistor, a seventeenth MOS transistor, and the eighteenth MOS transistor;

a gate of the fifteenth MOS transistor is connected to a gate of the eighteenth MOS transistor as the input terminal of the second amplification circuit; a source of the fifteenth MOS transistor is connected to the drain of the twelfth MOS transistor; a drain of the fifteenth MOS transistor is connected to a drain and a gate of the sixteenth MOS transistor and a gate of the seventeenth MOS transistor, respectively;

a drain of the seventeenth MOS transistor is connected to the second digital inverter and a drain of the eighteenth MOS transistor, respectively;

both the sixteenth MOS transistor and the seventeenth MOS transistor are the first conductivity type MOS transistors; and both the fifteenth MOS transistor and the eighteenth MOS transistor are the second conductivity type MOS transistors.

12. The ring voltage control oscillator of claim 11, wherein the isolation buffer unit further comprises a nineteenth MOS transistor and a twentieth MOS transistor;

a gate of the nineteenth MOS transistor is connected to the conversion unit and a gate of the twentieth MOS transistor, respectively; both a source of the nineteenth MOS transistor and a source of the twentieth MOS are connected to the power source;

a drain of the nineteenth MOS transistor is connected to the source of the eleventh MOS transistor and the source of the eighteenth MOS transistor, respectively;

a drain of the twentieth MOS transistor is connected to the source of the twelfth MOS transistor and the source of the fifteenth MOS transistor, respectively.

13. The ring voltage control oscillator of claim 11, wherein the eleventh MOS transistor and the eighteenth MOS transistor, the twelfth MOS transistor and the fifteenth MOS transistor, the thirteenth MOS transistor and the seventeenth MOS transistor, the fourteenth MOS transistor and the sixteenth MOS transistor, and the first digital inverter and the second digital inverter are centrally symmetrically arranged, respectively.

14. A phase locked loop, comprising a ring voltage control oscillator of claim 1.

* * * * *